(12) United States Patent
Carr et al.

(10) Patent No.: US 11,024,536 B2
(45) Date of Patent: Jun. 1, 2021

(54) CONTACT INTERLAYER DIELECTRIC REPLACEMENT WITH IMPROVED SAC CAP RETENTION

(71) Applicant: International Business Machines Corporation, Armonk, NY (US)

(72) Inventors: Adra Carr, Albany, NY (US); Vimal Kamineni, Mechanicville, NY (US); Ruilong Xie, Niskayuna, NY (US); Andrew Greene, Slingerlands, NY (US); Nigel Cave, Saratoga Springs, NY (US); Veeraraghavan Basker, Schenectady, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 2 days.

(21) Appl. No.: 16/387,687

(22) Filed: Apr. 18, 2019

(65) Prior Publication Data
US 2020/0335392 A1 Oct. 22, 2020

(51) Int. Cl.
*H01L 21/768* (2006.01)

(52) U.S. Cl.
CPC .... *H01L 21/76832* (2013.01); *H01L 21/7682* (2013.01); *H01L 21/76822* (2013.01); *H01L 21/76834* (2013.01); *H01L 21/76897* (2013.01)

(58) Field of Classification Search
None
See application file for complete search history.

(56) References Cited

U.S. PATENT DOCUMENTS

| 5,559,055 | A | 9/1996 | Chang et al. |
| 5,880,018 | A | 3/1999 | Boeck et al. |
| 6,423,628 | B1 | 7/2002 | Li et al. |
| 8,624,329 | B2 | 1/2014 | Lee et al. |
| 9,129,987 | B2 | 9/2015 | Wan et al. |
| 9,985,107 | B2 | 5/2018 | Cheng et al. |
| 2005/0272248 | A1 | 12/2005 | Kloster et al. |
| 2012/0153405 | A1 | 6/2012 | Heinrich et al. |
| 2016/0148846 | A1* | 5/2016 | Ok ............... H01L 21/76831 257/369 |
| 2018/0090375 | A1 | 3/2018 | Pranatharthiharan et al. |
| 2018/0197970 | A1* | 7/2018 | Pan ................ H01L 23/485 |
| 2018/0342420 | A1* | 11/2018 | You ................ H01L 23/535 |
| 2019/0043959 | A1* | 2/2019 | Lee ................. H01L 21/283 |

* cited by examiner

*Primary Examiner* — Steven M Christopher
(74) *Attorney, Agent, or Firm* — Cantor Colburn LLP; Joseph Petrokaitis

(57) ABSTRACT

Embodiments of the present invention are directed to reducing the effective capacitance between active devices at the contact level. In a non-limiting embodiment of the invention, an interlayer dielectric is replaced with a low-k material without damaging a self-aligned contact (SAC) cap. A gate can be formed over a channel region of a fin. The gate can include a gate spacer and a SAC cap. Source and drain regions can be formed adjacent to the channel region. A contact is formed on the SAC cap and on surfaces of the source and drain regions. A first dielectric layer can be recessed to expose a sidewall of the contact and a sidewall of the gate spacer. A second dielectric layer can be formed on the recessed surface of the first dielectric layer. The second dielectric layer can include a dielectric material having a dielectric constant less than the first dielectric layer.

14 Claims, 15 Drawing Sheets

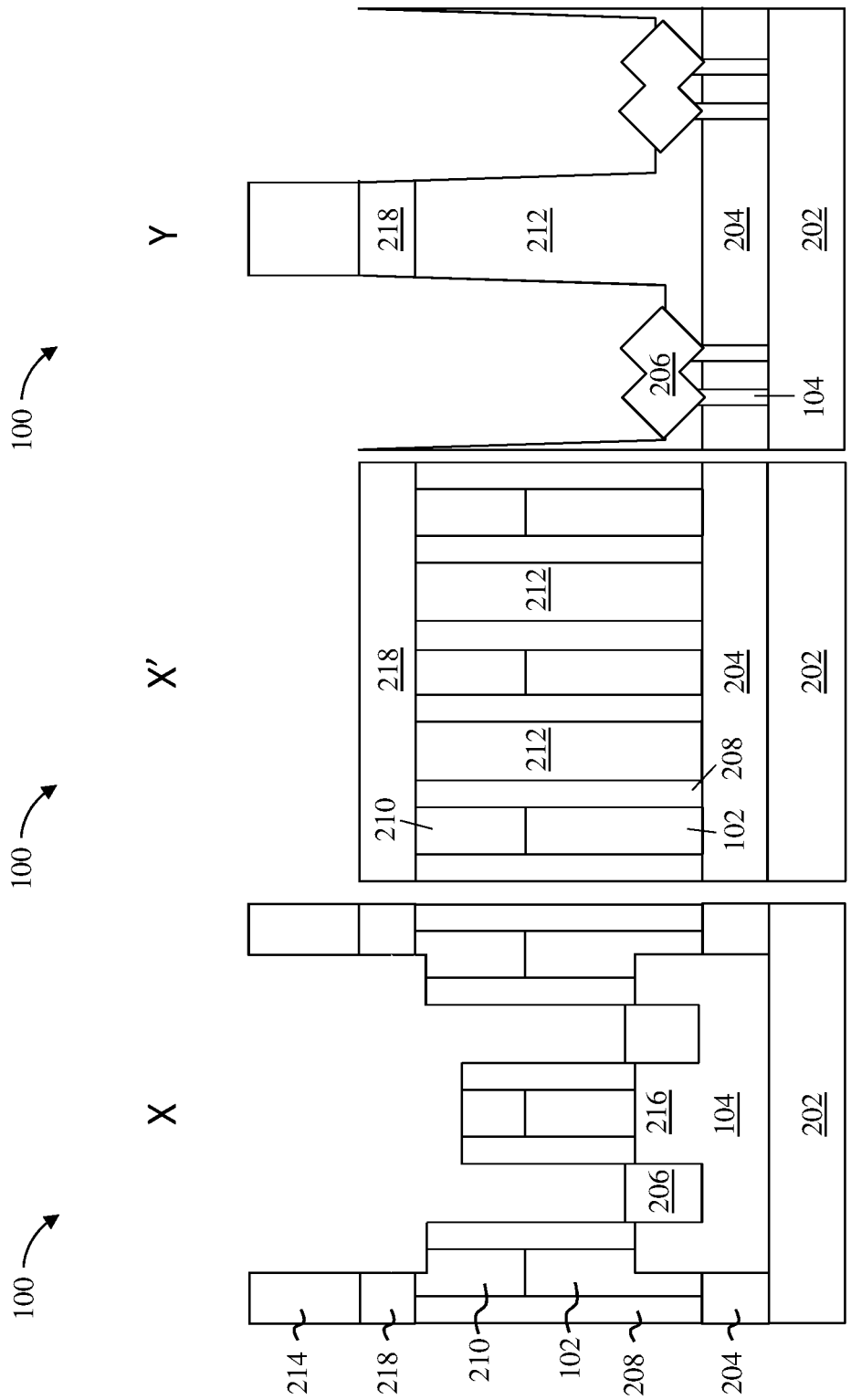

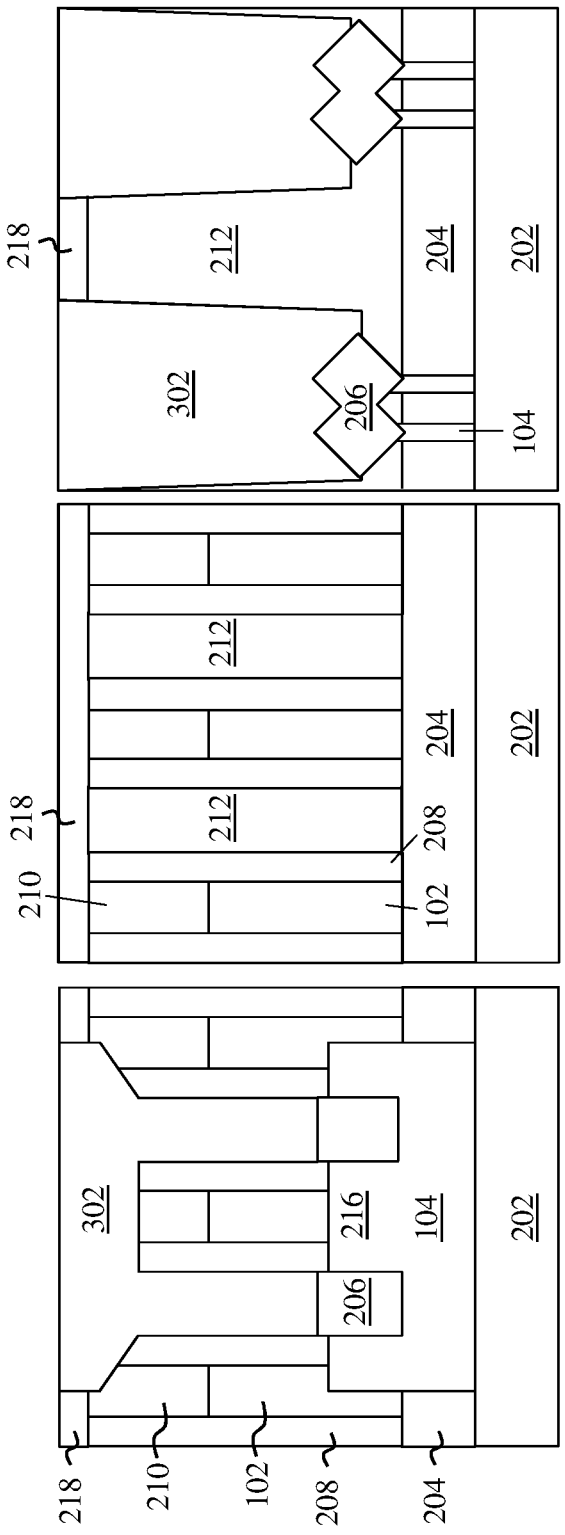

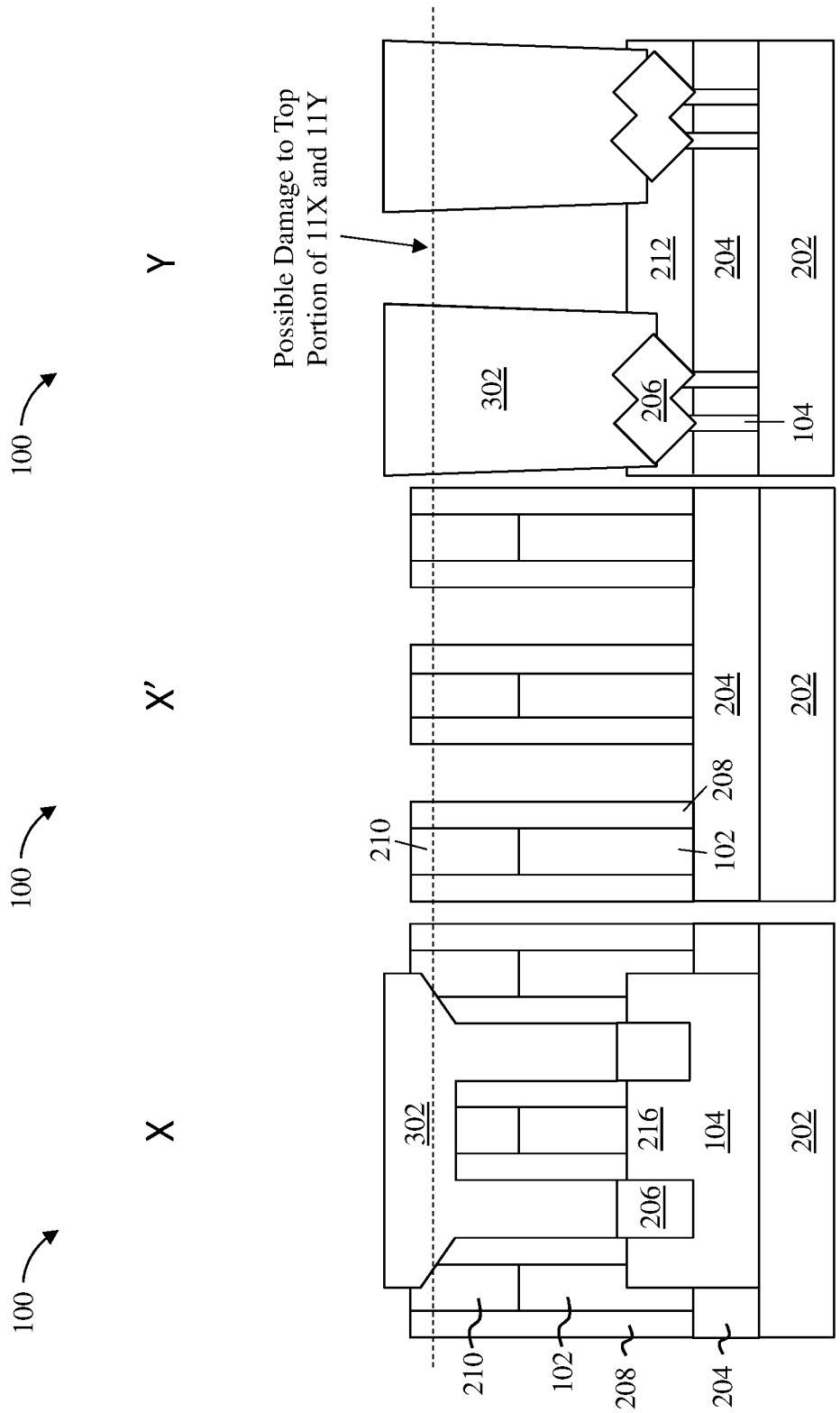

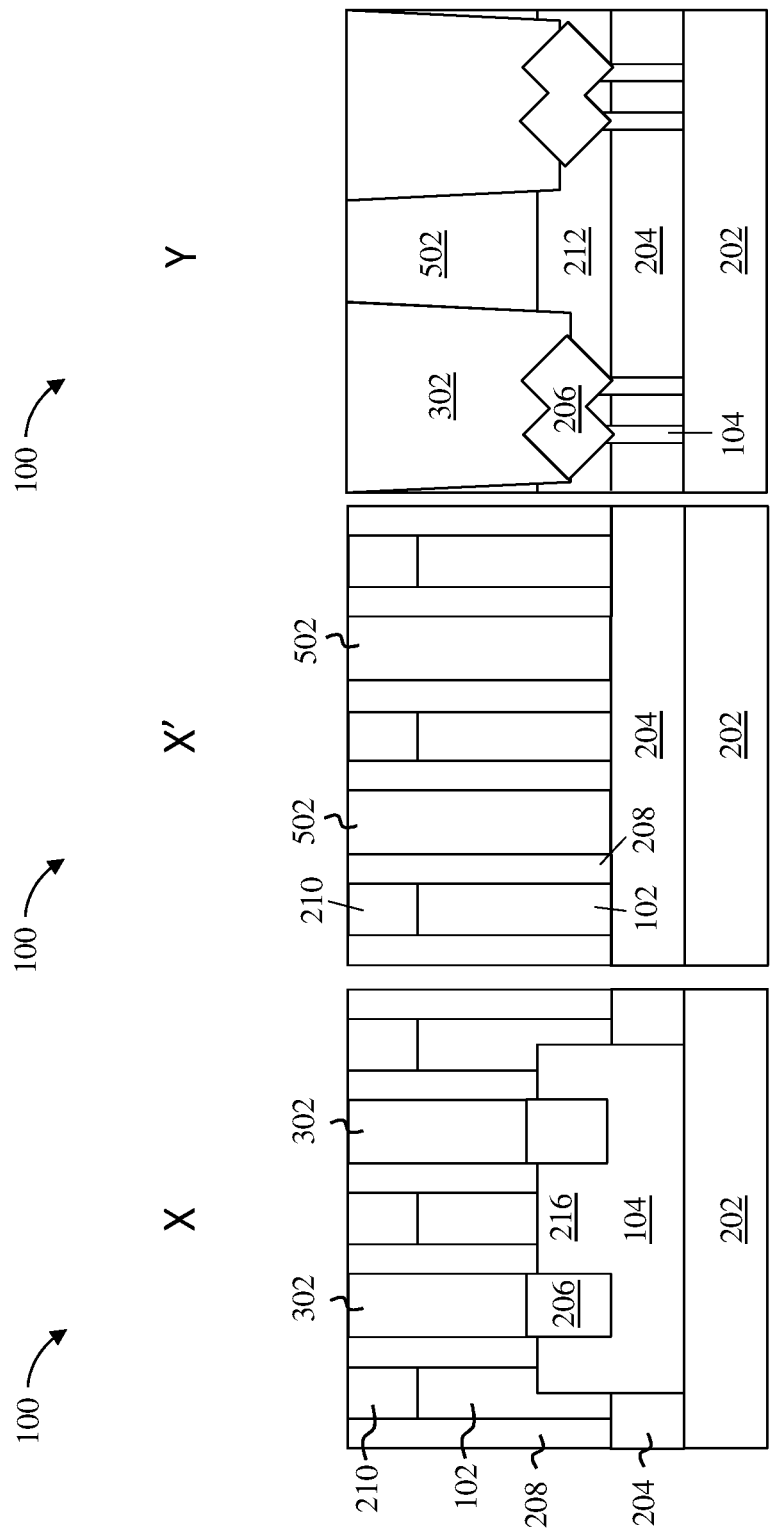

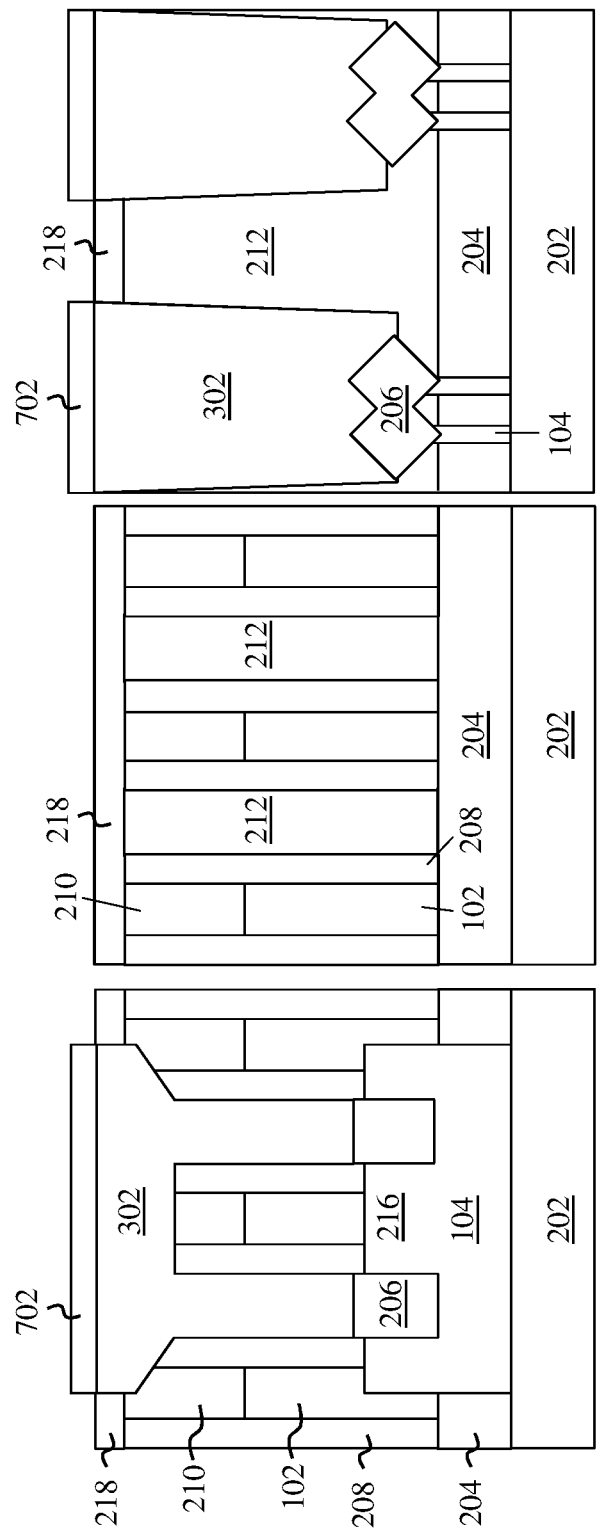

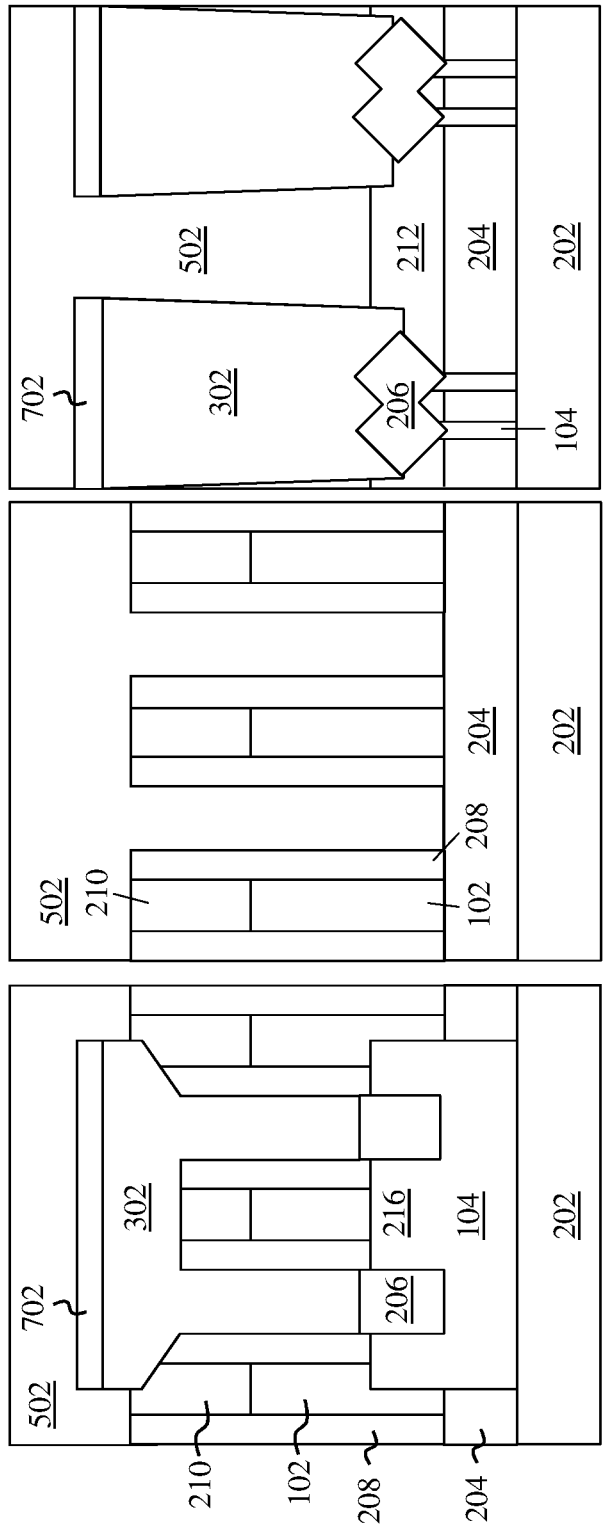

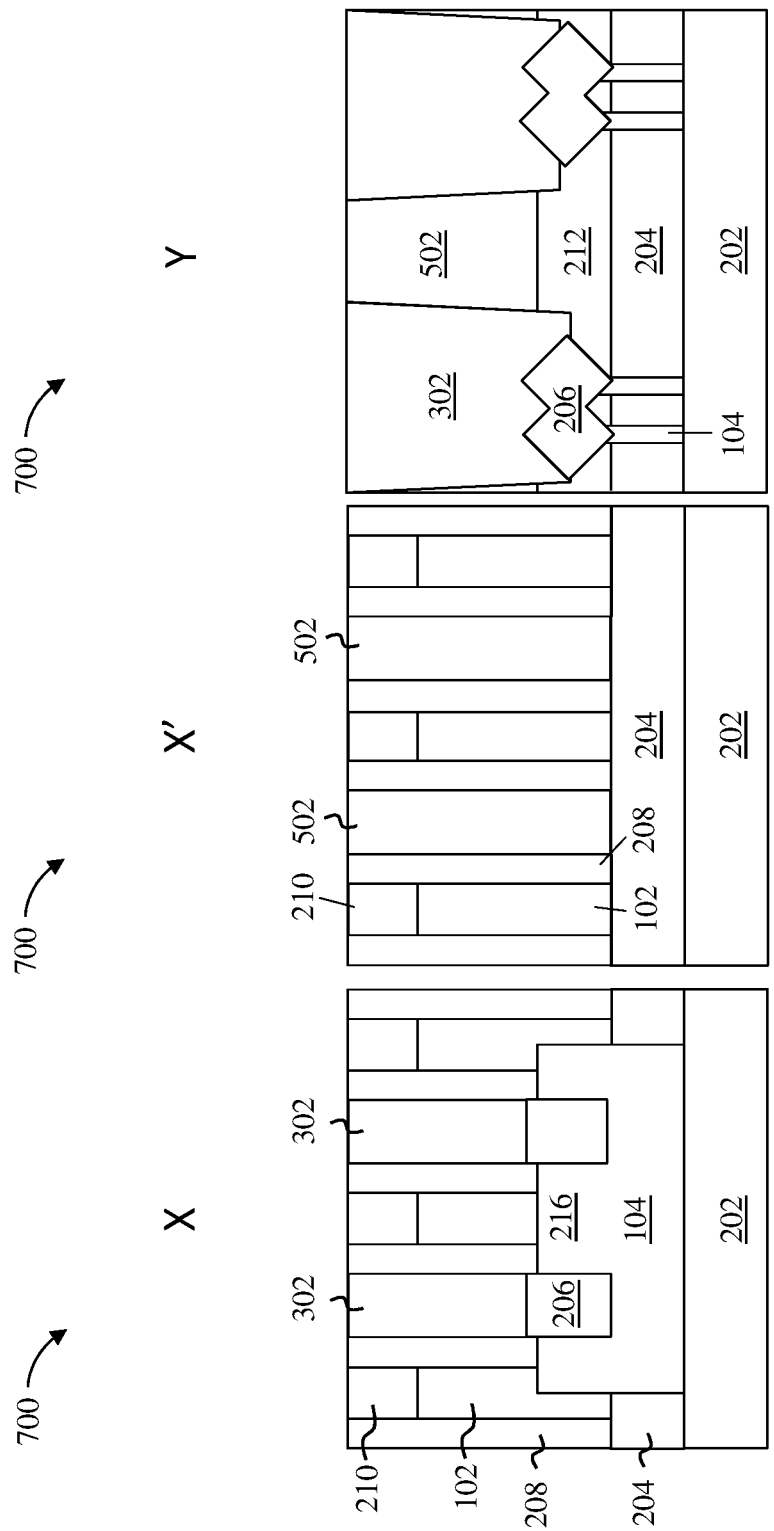

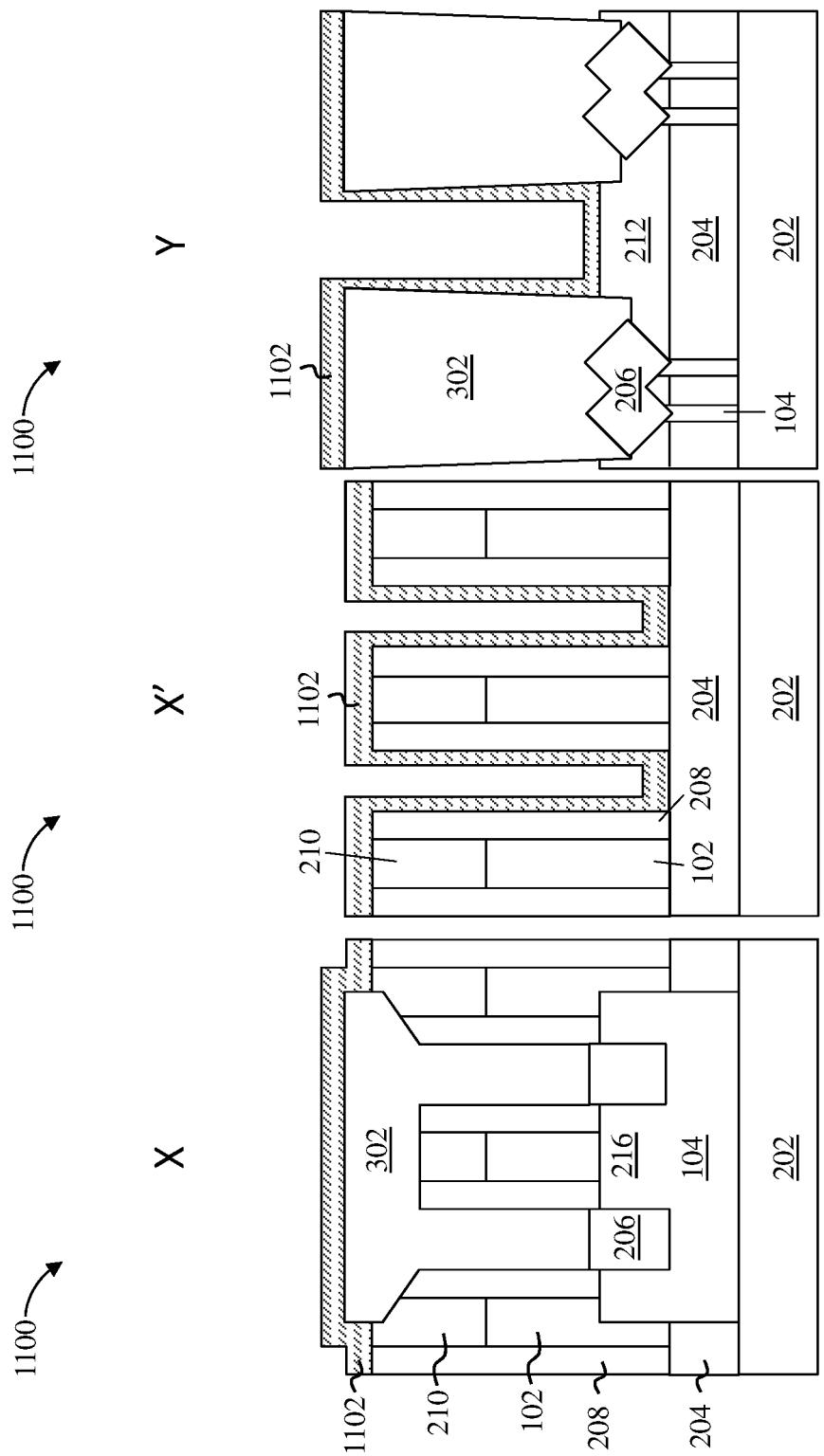

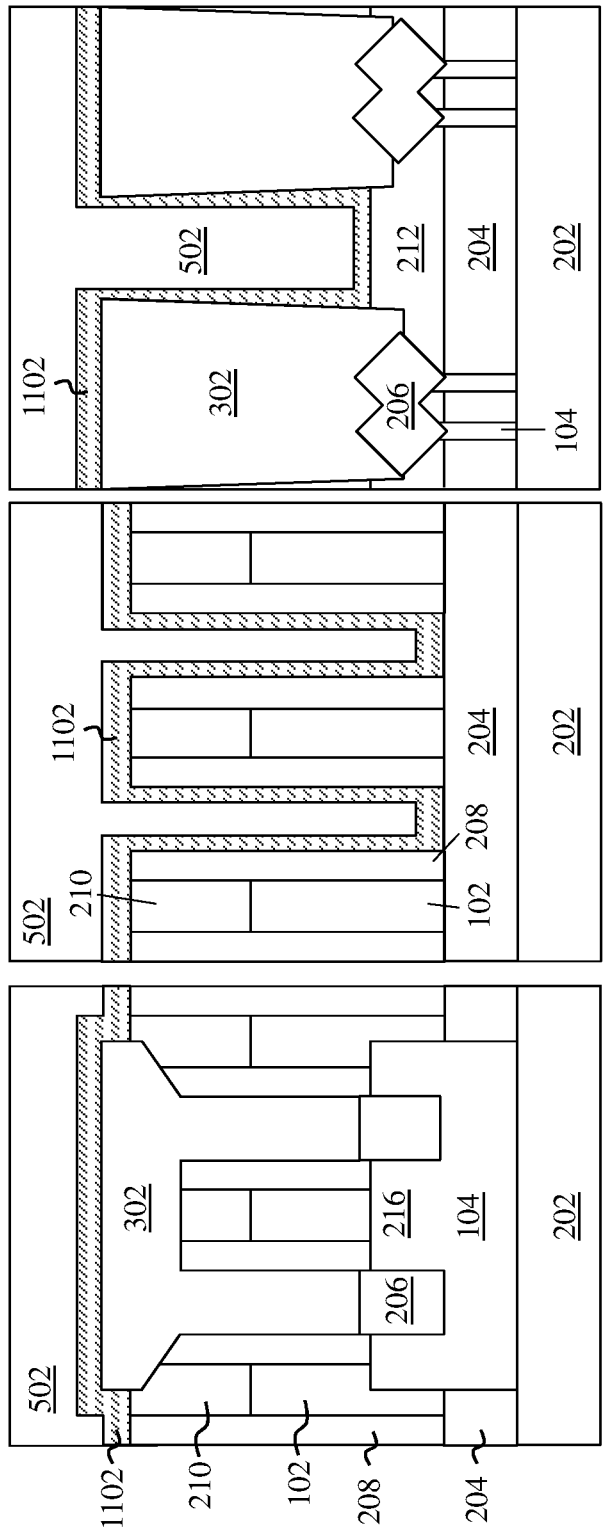

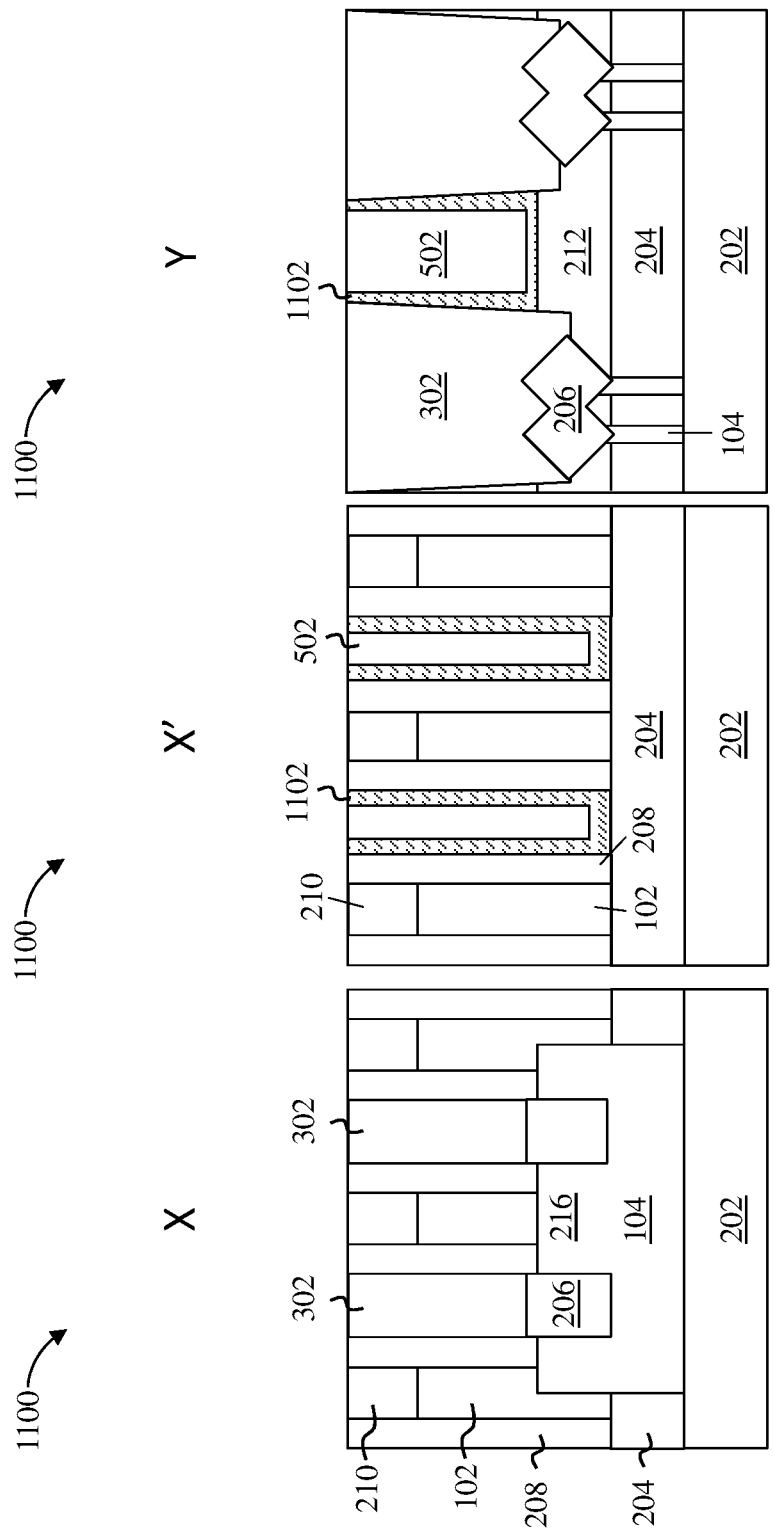

CONTACT INTERLAYER DIELECTRIC REPLACEMENT WITH IMPROVED SAC CAP RETENTION

BACKGROUND

The present invention generally relates to fabrication methods and resulting structures for semiconductor devices, and more specifically, to replacing a contact interlayer dielectric while improving self-aligned contact (SAC) cap retention.

Traditional metal oxide semiconductor field effect transistor (MOSFET) fabrication techniques include process flows for constructing planar field effect transistors (FETs). A planar FET includes a substrate (also referred to as a silicon slab), a gate formed over the substrate, source and drain regions formed on opposite ends of the gate, and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. For example, fin-type field effect transistors (finFETs) employ non-planar body regions in which the channel, source, and drain regions of the finFET are formed. A gate runs along the sidewalls and a top surface of the channel portion of each semiconductor fin, enabling fuller depletion in the channel region, and reducing short-channel effects due to steeper subthreshold swing (SS) and smaller drain induced barrier lowering (DIBL).

SUMMARY

Embodiments of the invention are directed to a method for reducing the effective capacitance between active devices at the contact level. A non-limiting example of the method includes forming a gate over a channel region of a fin. The gate can include a gate spacer and a gate hard mask. Source and drain regions can be formed adjacent to the channel region. A contact is formed on the gate hard mask and on surfaces of the source and drain regions. A first dielectric layer can be recessed to expose a sidewall of the contact and a sidewall of the gate spacer. A second dielectric layer can be formed on the recessed surface of the first dielectric layer. The second dielectric layer can include a dielectric material having a dielectric constant less than the first dielectric layer. The contact prevents erosion of the gate hard mask when recessing the first dielectric layer.

Embodiments of the invention are directed to a method for reducing the effective capacitance between active devices at the contact level. A non-limiting example of the method includes forming a gate over a channel region of a fin. A SAC cap is formed over the gate and a contact is formed on the SAC cap. A first dielectric layer is formed on a sidewall of the gate. The first dielectric layer can include a first dielectric material having a first dielectric constant. The first dielectric layer can be recessed to expose a sidewall of the contact and a second dielectric layer can be formed on a recessed surface of the first dielectric layer. The second dielectric layer can include a second dielectric material having a second dielectric constant less than the first dielectric constant. The contact prevents erosion of the gate hard mask when recessing the first dielectric layer.

Embodiments of the invention are directed to a semiconductor structure. A non-limiting example of the semiconductor device includes a gate over a channel region of a fin. The gate includes a gate spacer and a gate hard mask. The semiconductor device can include a source adjacent to a first end of the channel region and a drain adjacent to a second end of the channel region. The semiconductor device can include a first contact on a surface of the source and a second contact on a surface of the drain. A first dielectric layer is formed on a sidewall of the first contact and on a sidewall of the second contact. The first dielectric layer includes a first dielectric material having a first dielectric constant. A second dielectric layer is formed on a surface of the first dielectric layer. The second dielectric layer includes a second dielectric material having a second dielectric constant less than the first dielectric constant. A first portion of the second dielectric layer can be on a sidewall of the gate spacer and a second portion of the second dielectric layer can be on the sidewall of the first contact and on the sidewall of the second contact.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2A depicts a cross-sectional view of the semiconductor structure shown in FIG. 1 along the line X after a processing operation according to one or more embodiments of the invention;

FIG. 2B depicts a cross-sectional view of the semiconductor structure shown in FIG. 1 along the line X' after a processing operation according to one or more embodiments of the invention;

FIG. 2C depicts a cross-sectional view of the semiconductor structure shown in FIG. 1 along the line Y after a processing operation according to one or more embodiments of the invention;

FIG. 3A depicts a cross-sectional view of the semiconductor structure shown in FIG. 1 along the line X after a processing operation according to one or more embodiments of the invention;

FIG. 3B depicts a cross-sectional view of the semiconductor structure shown in FIG. 1 along the line X' after a processing operation according to one or more embodiments of the invention;

FIG. 3C depicts a cross-sectional view of the semiconductor structure shown in FIG. 1 along the line Y after a processing operation according to one or more embodiments of the invention;

FIG. 4A depicts a cross-sectional view of the semiconductor structure shown in FIG. 1 along the line X after a processing operation according to one or more embodiments of the invention;

FIG. 4B depicts a cross-sectional view of the semiconductor structure shown in FIG. 1 along the line X' after a processing operation according to one or more embodiments of the invention;

FIG. 4C depicts a cross-sectional view of the semiconductor structure shown in FIG. 1 along the line Y after a processing operation according to one or more embodiments of the invention;

FIG. 6A depicts a cross-sectional view of the semiconductor structure shown in FIG. 1 along the line X after a processing operation according to one or more embodiments of the invention;

FIG. 6B depicts a cross-sectional view of the semiconductor structure shown in FIG. 1 along the line X' after a processing operation according to one or more embodiments of the invention;

FIG. 6C depicts a cross-sectional view of the semiconductor structure shown in FIG. 1 along the line Y after a processing operation according to one or more embodiments of the invention;

FIG. 7A depicts a cross-sectional view of the semiconductor structure shown in FIG. 1 along the line X after a processing operation according to one or more embodiments of the invention;

FIG. 7B depicts a cross-sectional view of the semiconductor structure shown in FIG. 1 along the line X' after a processing operation according to one or more embodiments of the invention;

FIG. 7C depicts a cross-sectional view of the semiconductor structure shown in FIG. 1 along the line Y after a processing operation according to one or more embodiments of the invention;

FIG. 9A depicts a cross-sectional view of the semiconductor structure shown in FIG. 1 along the line X after a processing operation according to one or more embodiments of the invention;

FIG. 9B depicts a cross-sectional view of the semiconductor structure shown in FIG. 1 along the line X' after a processing operation according to one or more embodiments of the invention;

FIG. 9C depicts a cross-sectional view of the semiconductor structure shown in FIG. 1 along the line Y after a processing operation according to one or more embodiments of the invention;

FIG. 10A depicts a cross-sectional view of the semiconductor structure shown in FIG. 1 along the line X after a processing operation according to one or more embodiments of the invention;

FIG. 10B depicts a cross-sectional view of the semiconductor structure shown in FIG. 1 along the line X' after a processing operation according to one or more embodiments of the invention;

FIG. 10C depicts a cross-sectional view of the semiconductor structure shown in FIG. 1 along the line Y after a processing operation according to one or more embodiments of the invention;

FIG. 11A depicts a cross-sectional view of the semiconductor structure shown in FIG. 1 along the line X after a processing operation according to one or more embodiments of the invention;

FIG. 11B depicts a cross-sectional view of the semiconductor structure shown in FIG. 1 along the line X' after a processing operation according to one or more embodiments of the invention;

FIG. 11C depicts a cross-sectional view of the semiconductor structure shown in FIG. 1 along the line Y after a processing operation according to one or more embodiments of the invention;

FIG. 12A depicts a cross-sectional view of the semiconductor structure shown in FIG. 1 along the line X after a processing operation according to one or more embodiments of the invention;

FIG. 12B depicts a cross-sectional view of the semiconductor structure shown in FIG. 1 along the line X' after a processing operation according to one or more embodiments of the invention;

FIG. 12C depicts a cross-sectional view of the semiconductor structure shown in FIG. 1 along the line Y after a processing operation according to one or more embodiments of the invention;

FIG. 13A depicts a cross-sectional view of the semiconductor structure shown in FIG. 1 along the line X after a processing operation according to one or more embodiments of the invention;

FIG. 13B depicts a cross-sectional view of the semiconductor structure shown in FIG. 1 along the line X' after a processing operation according to one or more embodiments of the invention;

FIG. 13C depicts a cross-sectional view of the semiconductor structure shown in FIG. 1 along the line Y after a processing operation according to one or more embodiments of the invention;

Figure 1:
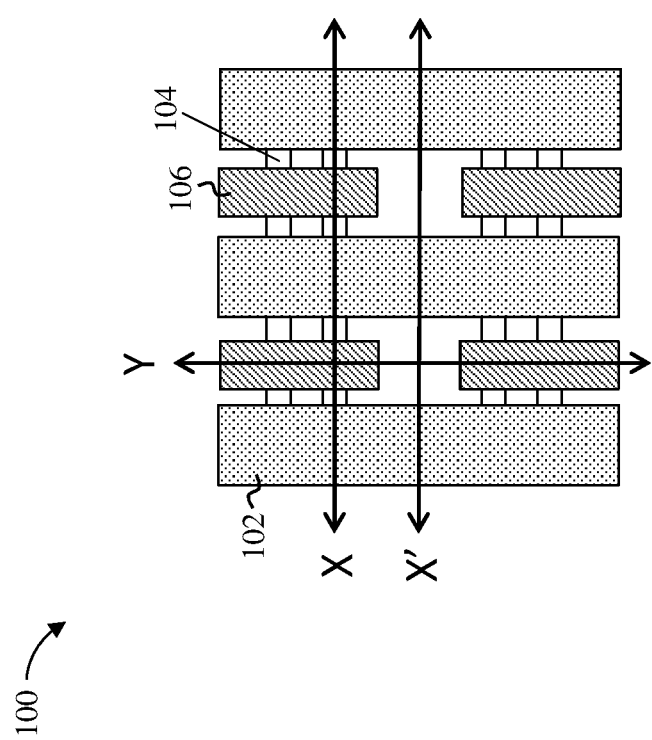
FIG. 1 depicts a top-down view of a semiconductor structure after a processing operation according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, recent contact resistivity improvements has resulted in dramatic reductions in the "on-resistance" (RON) of finFET devices. As RON decreases, reductions in parasitic capacitance become desirable. This is because parasitic capacitance contributes to undesired device effects such as resistive-capacitive (RC) delay, power dissipation, and cross-talk. RC delay refers to the delay in signal speed or propagation experienced in a circuit as a function of the product of the resistance and capacitance of the circuit components. In other words, reducing parasitic capacitance in low RON devices is needed to optimize delay.

Various approaches to reduce parasitic capacitance in the conventional finFET process flow have been explored, to varying degrees of success. Conventional approaches (e.g., gate spacer air gaps), however, do not address the relatively large area between the active regions of the substrate. Addressing this area is difficult, as modifying the area between the active regions can result in inadvertently damaging the device, especially the self-aligned contact (SAC) cap used in conventional finFET process flows.

Turning now to an overview of aspects of the present invention, one or more embodiments of the invention address the above-described shortcomings of the prior art by providing a new semiconductor structure and method that reduces the effective capacitance between active devices at the contact level by replacing the conventional interlayer dielectric oxide with an ultra low-k material (i.e., a material having a dielectric constant less than about 3.0) using a scheme that retains a maximum amount of SAC cap. In some embodiments of the invention, a SAC cap is formed over a gate and a source/drain region is formed adjacent to the gate. A source/drain contact is formed on a surface of the source/drain region. The source/drain contact is planarized to a surface of a hard mask formed over the SAC cap, ensuring that an overburden remains over the SAC cap. This overburden protects the SAC from erosion during subsequent processing steps (e.g., the interlayer dielectric etch). After forming the overburden, a portion of the interlayer dielectric is removed and replaced with an ultra low-k material.

In some embodiments of the invention, a selective cap material is deposited over an exposed surface of the source/drain contact prior to the interlayer dielectric etch back for additional protection. In some embodiments of the invention, a protective liner (e.g., a nitride liner) is deposited over the structure after the etch back, but prior to depositing the ultra low-k material. The protective liner provides a barrier between the source/drain contact metal and the ultra low-k (ULK) material, avoiding direct ULK deposition on the source/drain contact metal. This protective liner can also strengthen a damaged SAC cap and/or gate hard mask prior to downstream processes.

This new semiconductor structure and method results in a reduction in the effective capacitance (and overall delay) of the active devices over current integration schemes that utilize oxide between the active devices, and does so without damaging the device. Advantageously, reducing the effective capacitance between active devices by replacing a conventional interlayer dielectric (e.g., an oxide having a dielectric constant of about 4.5 when taking into account the presence of nitride spacers) with a lower dielectric constant material (e.g., a material having a dielectric constant of less than or equal to about 3) can provide up to a 4 percent improvement in delay.

Turning now to a more detailed description of aspects of the present invention, FIG. 1 depicts a top-down view of a semiconductor structure 100 during an intermediate operation of a method of fabricating a final semiconductor device according to one or more embodiments of the invention. In embodiments of the invention, the final semiconductor device can be a variety of types of MOSFETs, including, for example, non-planar n-type field effect transistors (NFET) and p-type field effect transistors (PFET). For example, the final semiconductor device can be an n-type finFET or a p-type finFET. In the embodiment shown in FIG. 1, the semiconductor structure 100 includes one or more gates 102 formed over channel regions of one or more fins 104. The semiconductor structure 100 can also include one or more trench silicide contacts 106. While described with respect to the finFET transistor architecture for ease of illustration, it is understood that the method can be applied to other transistor architectures, such as, for example, nanosheet or gate-all-around transistor architectures.

As best shown in FIGS. 2A and 2C, the fins 104 are formed on a substrate 202. The fins 104 can be formed on the substrate 202 using known FEOL finFET fabrication techniques. The substrate 202 and the fins 104 can be made of any suitable semiconductor material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments of the invention, the substrate 202 and the fins 104 can be made of the same semiconductor material. In other embodiments of the invention, the substrate 202 can be made of a first semiconductor material, and the fins 104 can be made of a second semiconductor material. In some embodiments of the invention, the substrate 202 and the fins 104 can be made of silicon or SiGe. In some embodiments of the invention, the substrate 202 is silicon and the fins 104 are silicon germanium having a germanium concentration of about 10 to about 80 percent. The fins 104 can each have a height ranging from 4 nm to 150 nm. In some embodiments of the present invention, the fins 104 are formed to a height of about 60 nm, although other fin heights are within the contemplated scope of the invention.

In some embodiments of the invention, the substrate 202 can include a buried oxide layer (not depicted). The buried oxide layer can be made of any suitable dielectric material, such as, for example, a silicon oxide. In some embodiments of the invention, the buried oxide layer is formed to a thickness of about 145 nm, although other thicknesses are within the contemplated scope of the invention. As best shown in FIG. 2A, in some embodiments of the invention, the semiconductor structure 100 can be electrically isolated from other regions of the substrate 202 by shallow trench isolation (STI) regions 204.

As best shown in FIG. 2A, the one or more gates 102 can be high-k metal gates (HKMGs) formed over a channel region 216 of the fins 104 using, for example, known replacement metal gate (RMG) processes, or so-called gate-first processes. The gates 102 can include a high-k dielectric material(s) (not shown) and a work function metal stack (not shown). In some embodiments, the gates 102 includes a main body formed from bulk conductive gate material(s).

In some embodiments of the invention, the gate dielectric is a high-k dielectric film formed on a surface (sidewall) of the fins 104. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of the invention.

In some embodiments of the invention, the gates 102 include one or more work function layers (sometimes referred to as a work function metal stack) formed between the high-k dielectric film and a bulk gate material. In some embodiments of the invention, the gates 102 include one or more work function layers, but do not include a bulk gate material.

If present, the work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layer can serve to modify the work function of the gates 102 and enables tuning of the device threshold voltage. The work function layers can be formed to a thickness of about 0.5 to 6 nm, although other thicknesses are within the contemplated scope of the invention. In some embodiments of the invention, each of the work function layers can be formed to a different thickness. In some embodiments of the invention, the work function layers include a TiN/TiC/TiCAl stack.

In some embodiments, the gates 102 includes a main body formed from bulk conductive gate material(s) deposited over the work function layers. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive gate material can further include dopants that are incorporated during or after deposition.

FIGS. 2A, 2B, and 2C depict cross-sectional views of the semiconductor structure 100 taken along the lines X, X', and Y of FIG. 1 after a processing operation according to one or more embodiments of the invention. As illustrated in FIG. 2A, the fins 104 can be formed over the substrate 202. As discussed previously, the STI region 204 electrically isolates the fins 104 from other devices on the substrate 202.

In some embodiments of the invention, spacers 208 (also known as sidewall spacers or gate spacers) are formed on sidewalls of the gates 102. In some embodiments of the invention, the spacers 208 are formed or patterned prior to forming the source and drain regions 206. In some embodiments of the invention, the spacers 208 are formed on sidewalls of a dummy gate that is replaced by the gates 102 during an RMG process. In some embodiments of the invention, the spacers 208 are formed using a chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, molecular beam epitaxy (MBE), or other like process in combination with a wet or dry etch process. For example, spacer material can be conformally deposited over the semiconductor structure 100 and selectively removed using a RIE to form the spacers 208. The spacers 208 can be made of any suitable material, such as, for example, a low-k dielectric, a nitride, silicon nitride, silicon oxide, SiON, SiC, SiOCN, or SiBCN. In some embodiments of the invention, the spacers 208 include silicon nitride. The spacers 208 can be formed to a thickness of about 5 to 40 nm, although other thicknesses are within the contemplated scope of the invention.

In some embodiments of the invention, source and drain regions 206 can be epitaxially grown on exposed surfaces of the fins 104. In some embodiments of the invention, the source and drain regions 206 are formed to a thickness of about 4 nm to about 20 nm, for example 10 nm, although other thicknesses are within the contemplated scope of the invention.

The source and drain regions 206 can be epitaxially grown using, for example, vapor-phase epitaxy (VPE), molecular beam epitaxy (MBE), liquid-phase epitaxy (LPE), or other suitable processes. The source and drain regions 206 can be semiconductor materials epitaxially grown from gaseous or liquid precursors.

In some embodiments of the invention, the gas source for the epitaxial deposition of semiconductor material includes a silicon containing gas source, a germanium containing gas source, or a combination thereof. For example, a Si layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A silicon germanium alloy layer can be epitaxially formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxially grown silicon and silicon germanium can be doped by adding n-type dopants (e.g., phosphorus or arsenic) or p-type dopants (e.g., Ga, B, BF2, or Al). In some embodiments of the invention, the source and drain regions 206 can be epitaxially formed and doped by a variety of methods, such as, for example, in-situ doped epitaxy (doped during deposition), doped following the epitaxy, or by implantation and plasma doping. The dopant concentration in the doped regions can range from $1\times10^{19}$ cm$^{-3}$ to $2\times10^{21}$ cm$^{-3}$, or between $1\times10^{20}$ cm$^{-3}$ and $1\times10^{21}$ cm$^{-3}$.

In some embodiments of the invention, the source and drain regions 206 are made of silicon germanium. In some embodiments of the invention, the source and drain regions 206 are made of silicon germanium having a germanium concentration of about 10 to about 65 percent, for example, 50 percent, although other germanium concentrations are within the contemplated scope of the invention. In some embodiments of the invention of the invention, the source and drain regions 206 can extend above a topmost surface of the fins 104.

As further depicted in FIG. 2A, the semiconductor structure 100 can also include one or more gate hard masks 210 (also referred to as self-aligned contact caps, or SAC caps) formed on each of the gates 102. The gate hard masks 210 can be made of any suitable material, such as, for example, silicon nitride.

As depicted in FIG. 2B, an interlayer dielectric 212 can be formed over the semiconductor structure 100. The interlayer dielectric 212 can be made of any suitable dielectric material, such as, for example, porous silicates, carbon doped oxides, silicon dioxides, silicon nitrides, silicon oxynitrides, or other dielectric materials. Any known manner of forming the interlayer dielectric 212 can be utilized, such as, for example, CVD, PECVD, ALD, flowable CVD, spin-on dielectrics, or PVD. In some embodiments of the invention, the interlayer dielectric 212 and the STI region 204 are made of the same dielectric material, and together define a single continuous dielectric region. In some embodiments of the invention, the interlayer dielectric 212 is formed prior to a dummy gate pull and the formation of the gates 102.

In some embodiments of the invention, a hard mask 218 (sometimes referred to as an oxide hard mask) can be formed over a surface of the interlayer dielectric 212, a surface of the spacers 208, and/or a surface of the gate hard masks 210. The hard mask 218 can be made of any suitable dielectric material, such as, for example, an oxide. Any known manner of forming the hard mask 218 can be utilized, such as, for example, CVD, PECVD, ALD, flowable CVD, spin-on dielectrics, or PVD.

In some embodiments of the invention, an organic planarization layer (OPL) 214 can be formed over the hard mask 218. The OPL 214 can be patterned to expose a surface of the gate hard masks 210 and a surface of the interlayer dielectric 212. The OPL 214 can be formed by a variety of methods, such as, for example, CVD, PECVD, UHVCVD, RTCVD, MOCVD, LRPCVD, ALD, PVD, chemical solution deposition, MBE, or other like process. In some embodiments of the invention, the OPL 214 can be applied using, for example, spin coating technology.

The OPL 214 can be made from any suitable OPL material. In some embodiments of the invention, the OPL 214 can include a photo-sensitive organic polymer having a light-sensitive material that, when exposed to electromagnetic (EM) radiation, is chemically altered. In other words, the OPL 214 can be configured to be removed using a developing solvent. For example, the photo-sensitive organic polymer can be polyacrylate resin, epoxy resin, phenol resin, polyamide resin, polyimide resin, unsaturated polyester resin, polyphenylenether resin, polyphenylenesulfide resin, or benzocyclobutene (BCB). In some embodiments of the invention, the OPL 214 can include any organic polymer and/or a photo-active compound having a molecular structure that can attach to the molecular structure of the organic polymer. In some embodiments of the invention, the OPL 214 is planarized, using, for example, a chemical-mechanical planarization (CMP) process. In some embodiments of the invention, the OPL 214 is a bottommost layer of a patterning stack (e.g., a tri-layer ARC stack having a photoresist and antireflective coating on the OPL 214).

As further depicted in FIG. 2A, exposed portions of the interlayer dielectric 212 can be removed to expose a surface of the source and drain regions 206. Portions of the interlayer dielectric 212 can be removed using any suitable method, such as a wet etch, a dry etch, or a combination of sequential wet and/or dry etches. In some embodiments of the invention, the interlayer dielectric 212 can be etched selective to the spacers 208, and/or the gate hard masks 210. For example, dielectric material (e.g., an oxide) can be etched using a directional RIE selective to SiN.

FIGS. 3A, 3B, and 3C depict cross-sectional views of the semiconductor structure 100 taken along the lines X, X', and Y of FIG. 1 after a processing operation according to one or more embodiments of the invention. As illustrated in FIG. 3A, source/drain contacts 302 (sometimes referred to as source/drain contact metals) can be formed over the source and drain regions 206.

The source/drain contacts 302 can be formed or deposited using known metallization techniques. In some embodiments of the invention, the source/drain contacts 302 is overfilled above a surface of the gate hard masks 210. The source/drain contacts 302 can be made of any suitable conducting material, such as, for example, metal (e.g., tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the source/drain contacts 302 are cobalt or tungsten contacts. The conductive material can further include dopants that are incorporated during or after deposition. In some embodiments of the invention, the source/drain contacts 302 can include a barrier metal liner (not depicted). Material examples include tantalum nitride and tantalum (TaN/Ta), titanium, titanium nitride, cobalt, ruthenium, and manganese.

In some embodiments of the invention, the source/drain contacts 302 are planarized after the deposition process, using for example, a chemical-mechanical planarization. In some embodiments of the invention, the planarization process is configured to stop on the hard mask 218. In other words, the source/drain contacts 302 can be planarized to a surface of the hard mask 218. In some embodiments of the invention, this planarization process can result in a recessing (thinning) of the hard mask 218. Stopping the planarization on the hard mask 218 leaves an overburden of the source/drain contacts 302 above a surface of the gate hard masks 210. Advantageously, this overburden protects the active gates and the SAC cap (i.e., the gate hard masks 210) during the subsequent interlayer dielectric etch (depicted in FIG. 4A).

FIGS. 4A, 4B, and 4C depict cross-sectional views of the semiconductor structure 100 taken along the lines X, X', and Y of FIG. 1 after a processing operation according to one or more embodiments of the invention. As illustrated in FIG. 4B, the interlayer dielectric 212 can be etched back (or recessed) to expose a surface of the gate hard masks 210, sidewalls of the spacers 208, and/or sidewalls of the source/drain contacts 302.

The interlayer dielectric 212 can be recessed using any suitable method, such as a wet etch, a dry etch, or a combination of sequential wet and/or dry etches. In some embodiments of the invention, the interlayer dielectric 212 can be recessed selective to the source/drain contacts 302, the spacers 208, and/or the gate hard masks 210. For example, dielectric material (e.g., an oxide) can be etched using a directional RIE (or anisotropic etch) selective to Co, W, and/or SiN. In some embodiments of the invention, the dielectric etch back can result in damage to a top portion of the source/drain contacts 302, the spacers 208, and/or the gate hard masks 210 not covered by the source/drain contacts 302 (the potentially damaged top portion is depicted above the dotted line in FIGS. 4A, 4B, and 4C). Advantageously, the active gates (i.e., the center gate depicted in FIG. 4A) are completely covered by the source/drain contacts 302, and are consequently not exposed during the etch of the interlayer dielectric 212. As a result, the active gates are not eroded during this process.

Figures 5A, 5B, 5C:
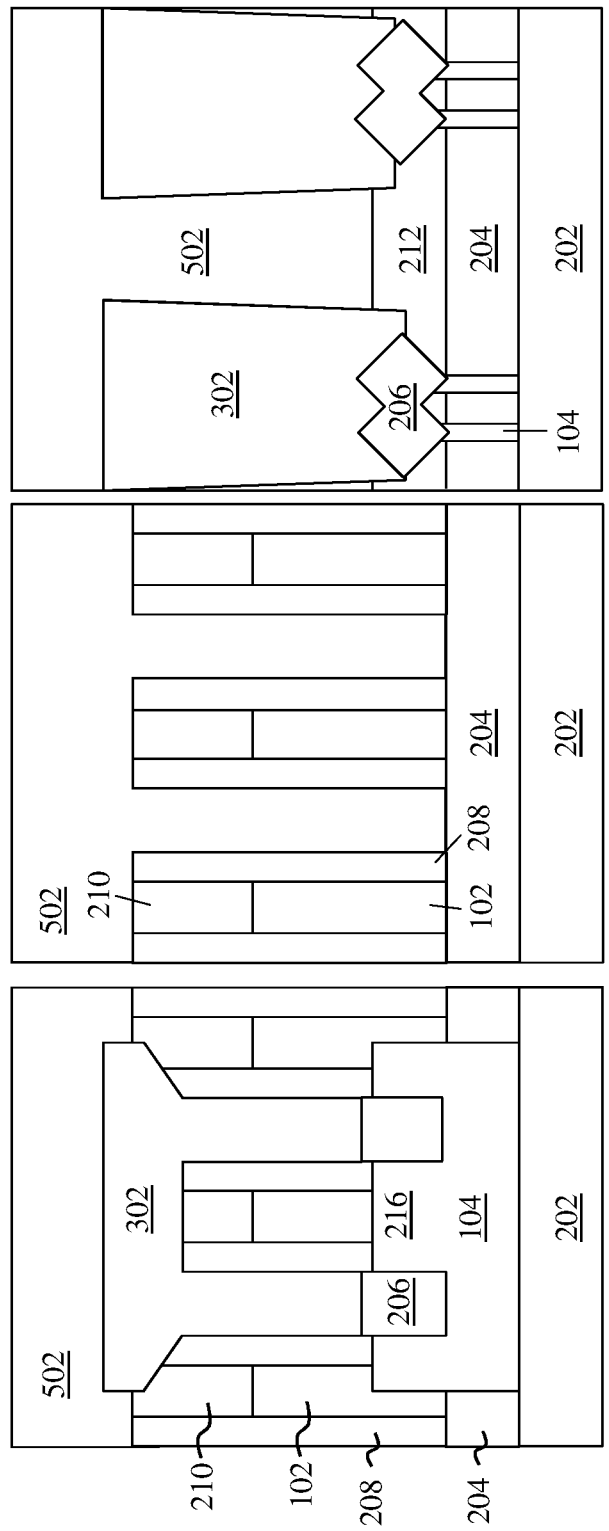
FIG. 5A depicts a cross-sectional view of the semiconductor structure shown in FIG. 1 along the line X after a processing operation according to one or more embodiments of the invention.
FIG. 5B depicts a cross-sectional view of the semiconductor structure shown in FIG. 1 along the line X' after a processing operation according to one or more embodiments of the invention.
FIG. 5C depicts a cross-sectional view of the semiconductor structure shown in FIG. 1 along the line Y after a processing operation according to one or more embodiments of the invention.

FIGS. 5A, 5B, and 5C depict cross-sectional views of the semiconductor structure 100 taken along the lines X, X', and Y of FIG. 1 after a processing operation according to one or more embodiments of the invention. As illustrated in FIG. 5B, a dielectric layer 502 can be formed over the semiconductor structure 100. As discussed previously herein, the dielectric layer 502 can be made of an ultra low-k dielectric material (e.g., the dielectric layer 502 can be made of a material having a dielectric constant less than 3.0).

The dielectric layer 502 can be formed or deposited using known processes, such as flowable dielectric deposition processes, spin-on coatings, or other known processes. Example ultra low-k dielectric materials can include, for example, porous organosilicate glass (OSG), carbon-doped oxide (CDO), porous silicon dioxide, spin-on organic polymeric dielectrics (e.g., polyimide, polynorbornenes, benzocyclobutene, and polytetrafluoroethylene (PTFE)), hydrogen silsesquioxane (HSQ), and methylsilsesquioxane (MSQ).

FIGS. 6A, 6B, and 6C depict cross-sectional views of the semiconductor structure 100 taken along the lines X, X', and Y of FIG. 1 after a processing operation according to one or more embodiments of the invention. As illustrated in FIG. 6B, the semiconductor structure 100 can be planarized below the potentially damaged surfaces of the source/drain contacts 302, the spacers 208, and/or the gate hard masks 210 (as depicted in FIGS. 4A, 4B, and 4C). The semiconductor structure 100 can be planarized, using, for example, a chemical-mechanical planarization (CMP) process. As depicted in FIG. 6A, the source/drain contacts 302 can be recessed during this planarization process to a level sufficient to define separate source/drain contacts 302 (i.e., two contacts separated by a gate of the gates 102). In other words, the semiconductor structure 100 can be planarized below a surface of the connected overburden of the source/drain contacts 302.

FIGS. 7A, 7B, and 7C depict cross-sectional views of a semiconductor structure 700 taken along the lines X, X', and Y of FIG. 1 after a processing operation according to one or more embodiments of the invention. FIGS. 7A, 7B, and 7C illustrate an alternative embodiment whereby a selective cap 702 is formed over the source/drain contacts 302 after the process steps depicted in FIGS. 3A, 3B, and 3C. In other words, the process depicted in FIGS. 7A, 7B, and 7C can proceed after forming the source/drain contacts 302 over the source and drain regions 206 as depicted in FIGS. 3A, 3B, and 3C.

As discussed previously herein, the selective cap 702 can provide additional protection to the exposed surface of the source/drain contacts 302. As a result, the source/drain contacts 302 can better protect the covered gate hard masks 210 (i.e., the active gates). The selective cap 702 can be deposited using, for example, a selective deposition process. For example, tungsten, ruthenium, and/or cobalt silicide can be selectively deposited over the metal surface of the source/drain contacts 302 ("selectively deposited" means that metal materials will only form on exposed metal surfaces, and will not form over dielectrics, such as the interlayer dielectric 212). The selective cap 702 can be formed to a thickness of 5 to 50 nm, although other thicknesses are within the contemplated scope of the invention.

Figures 8A, 8B, 8C:
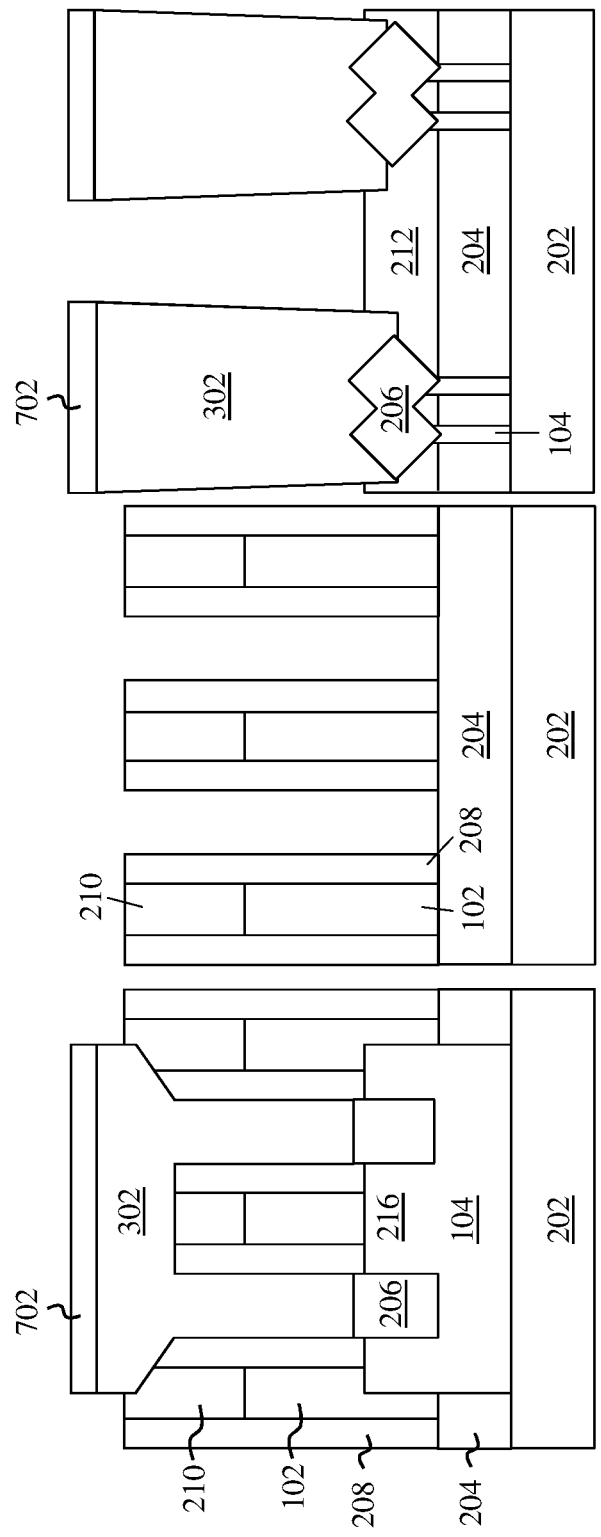
FIG. 8A depicts a cross-sectional view of the semiconductor structure shown in FIG. 1 along the line X after a processing operation according to one or more embodiments of the invention.
FIG. 8B depicts a cross-sectional view of the semiconductor structure shown in FIG. 1 along the line X' after a processing operation according to one or more embodiments of the invention.
FIG. 8C depicts a cross-sectional view of the semiconductor structure shown in FIG. 1 along the line Y after a processing operation according to one or more embodiments of the invention.

FIGS. 8A, 8B, and 8C depict cross-sectional views of the semiconductor structure 700 taken along the lines X, X', and Y of FIG. 1 after a processing operation according to one or more embodiments of the invention. As illustrated in FIG. 8B, the hard mask 218 can be removed and the interlayer dielectric 212 can be etched back (or recessed) to expose a surface of the gate hard masks 210, sidewalls of the spacers 208, and/or sidewalls of the source/drain contacts 302.

The interlayer dielectric 212 can be recessed using any suitable method, such as a wet etch, a dry etch, or a combination of sequential wet and/or dry etches. In some embodiments of the invention, the interlayer dielectric 212 can be recessed selective to the source/drain contacts 302, the spacers 208, and/or the gate hard masks 210. For example, dielectric material (e.g., an oxide) can be etched using a directional RIE selective to Co, W, and/or SiN. In some embodiments of the invention, the selective cap 702 mitigates any damage to a top portion of the source/drain contacts 302, the spacers 208, and/or the gate hard masks 210 caused by the etch back.

FIGS. 9A, 9B, and 9C depict cross-sectional views of the semiconductor structure 700 taken along the lines X, X', and Y of FIG. 1 after a processing operation according to one or more embodiments of the invention. As illustrated in FIG. 9B, a dielectric layer 502 can be formed over the semiconductor structure 100. As discussed previously herein, the dielectric layer 502 can be made of an ultra low-k dielectric material (e.g., the dielectric layer 502 can be made of a material having a dielectric constant less than 3.0).

The dielectric layer 502 can be formed or deposited using known processes, such as flowable dielectric deposition processes, spin-on coatings, or other known processes. Example ultra low-k dielectric materials can include, for example, porous OSG, CDO, porous silicon dioxide, spin-on organic polymeric dielectrics (e.g., polyimide, polynorbornenes, benzocyclobutene, and PTFE), HSQ, and MSQ FIGS. 10A, 10B, and 10C depict cross-sectional views of the semiconductor structure 700 taken along the lines X, X', and Y of FIG. 1 after a processing operation according to one or more embodiments of the invention. As illustrated in FIG. 10B, the semiconductor structure 100 can be planarized below the potentially damaged surfaces of the source/drain contacts 302, the spacers 208, and/or the gate hard masks 210 (as depicted in FIGS. 4A, 4B, and 4C). The semiconductor structure 100 can be planarized, using, for example, a chemical-mechanical planarization (CMP) process. As depicted in FIG. 10A, the source/drain contacts 302 can be recessed during this planarization process to a level sufficient to define separate source/drain contacts 302 (i.e., two contacts separated by a gate of the gates 102). In other words, the semiconductor structure 100 can be planarized below the selective cap 702 and below a surface of the connected overburden of the source/drain contacts 302.

FIGS. 11A, 11B, and 11C depict cross-sectional views of a semiconductor structure 1100 taken along the lines X, X', and Y of FIG. 1 after a processing operation according to one or more embodiments of the invention. FIGS. 11A, 11B, and 11C illustrate an alternative embodiment whereby a liner 1102 is formed over the semiconductor structure 1100 after the process steps depicted in FIGS. 4A, 4B, and 4C. In other words, the process depicted in FIGS. 11A, 11B, and 11C can proceed after the interlayer dielectric 212 etch back (or recess) exposes a surface of the gate hard masks 210, sidewalls of the spacers 208, and/or sidewalls of the source/drain contacts 302 as depicted in FIGS. 4A, 4B, and 4C.

As discussed previously herein, the liner 1102 can mitigate damage to the gate hard masks 210, the spacers 208, and/or the source/drain contacts 302 caused by the interlayer dielectric etch back. The liner 1102 can also serve as a diffusion barrier, protecting the source/drain contacts 302 from dielectric diffusion (i.e., the formation of metal-oxides) from the dielectric layer 502 (depicted in FIG. 12B). In some embodiments of the invention, the liner 1102 is conformally deposited over a surface of the source/drain contacts 302, a surface of the gate hard masks 210, a surface of the spacers 208, a surface of the STI region 204, and a surface of the interlayer dielectric 212. In some embodiments of the invention, the liner 1102 is formed using a CVD, PECVD, UHVCVD, RTCVD, MOCVD, LPCVD, LRPCVD, ALD, PVD, chemical solution deposition, MBE, or other like process. The liner 1102 can be made of any suitable material, such as, for example, a low-k dielectric, a nitride, silicon nitride, SiON, SiC, SiOCN, or SiBCN. In some embodiments of the invention, the liner 1102 includes silicon nitride. The liner 1102 can be formed to a thickness of about 5 nm or less, or 3 nm or less, although other thicknesses are within the contemplated scope of the invention.

FIGS. 12A, 12B, and 12C depict cross-sectional views of the semiconductor structure 1100 taken along the lines X, X', and Y of FIG. 1 after a processing operation according to one or more embodiments of the invention. As illustrated in FIG. 12B, a dielectric layer 502 can be formed over the semiconductor structure 100. As discussed previously herein, the dielectric layer 502 can be made of an ultra low-k dielectric material (e.g., the dielectric layer 502 can be made of a material having a dielectric constant less than 3.0).

The dielectric layer 502 can be formed or deposited using known processes, such as flowable dielectric deposition processes, spin-on coatings, or other known processes. Example ultra low-k dielectric materials can include, for example, porous OSG, CDO, porous silicon dioxide, spin-on organic polymeric dielectrics (e.g., polyimide, polynorbornenes, benzocyclobutene, and PTFE), HSQ, and MSQ.

FIGS. 13A, 13B, and 13C depict cross-sectional views of the semiconductor structure 1100 taken along the lines X, X', and Y of FIG. 1 after a processing operation according to one or more embodiments of the invention. As illustrated in FIG. 13B, the semiconductor structure 100 can be planarized below the potentially damaged surfaces of the source/drain contacts 302, the spacers 208, and/or the gate hard masks 210 (as depicted in FIGS. 4A, 4B, and 4C). The semiconductor structure 100 can be planarized, using, for example, a chemical-mechanical planarization (CMP) process. As depicted in FIG. 13A, the source/drain contacts 302 can be recessed during this planarization process to a level sufficient to define separate source/drain contacts 302 (i.e., two contacts separated by a gate of the gates 102). In other words, the semiconductor structure 100 can be planarized below a surface of the connected overburden of the source/drain contacts 302.

Figure 14:
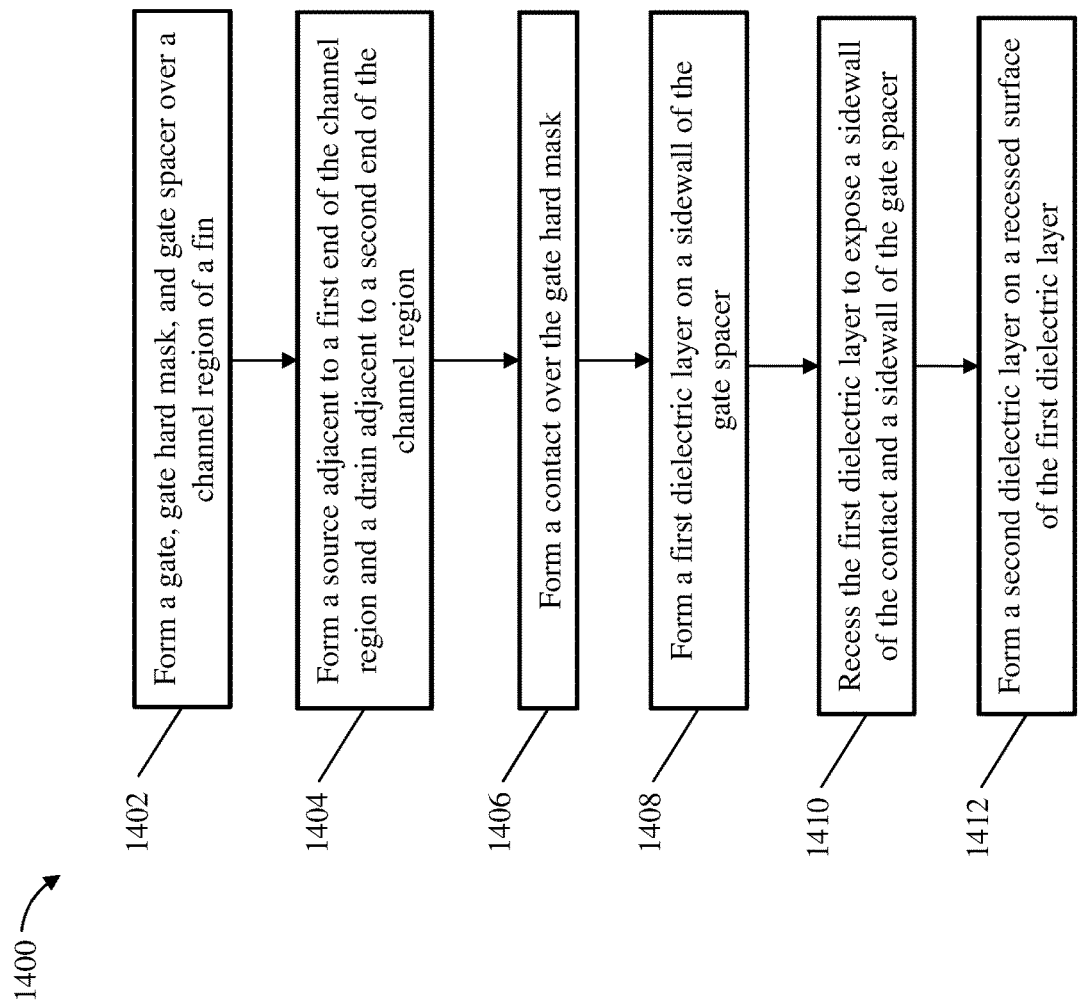
FIG. 14 depicts a flow diagram illustrating a method according to one or more embodiments of the invention.

FIG. 14 depicts a flow diagram 1400 illustrating a method for forming a semiconductor device according to one or more embodiments of the invention. As shown at block 1402, a gate is formed over a channel region of a fin. The gate can include a gate hard mask and a gate spacer. In some embodiments of the invention, the gate hard mask includes silicon nitride.

At block 1404, a source is formed adjacent to a first end of the channel region and a drain is formed adjacent to a second end of the channel region. In some embodiments of the invention (e.g., an RMG process), the source and drain can be formed before metal gate formation (i.e., while the dummy gate is in place).

At block 1406, a contact is formed on the gate hard mask. The contact can include a first portion on a surface of the source and a second portion on a surface of the drain. In some embodiments of the invention, the contact includes cobalt or tungsten. In some embodiments of the invention, the contact includes an overburden that covers a gate hard mask. As discussed previously herein, the contact can prevent erosion of the gate hard mask when recessing the first dielectric layer at block 1410.

At block 1408, a first dielectric layer is formed on a sidewall of the gate spacer. The first dielectric layer can include a first dielectric material having a first dielectric constant. In some embodiments of the invention, the first dielectric material includes silicon oxide and the first dielectric constant is about 3. In some embodiments of the invention, the first dielectric layer is formed on sidewalls of a dummy gate that is subsequently replaced by the gate (e.g., a metal gate) during an RMG module.

At block 1410, the first dielectric layer is recessed to expose a sidewall of the contact and a sidewall of the gate spacer. In some embodiments of the invention, recessing the first dielectric layer includes an etch back, such as previously described with respect to FIG. 4B. In some embodiments of the invention, the etch back is selective to a material of the SAC cap and/or a material of the gate hard mask. In some embodiments of the invention, the etch back damages a top portion of the SAC cap, but does not damage the covered active gates, as discussed previously herein.

At block 1412, a second dielectric layer is formed on a recessed surface of the first dielectric layer. The second dielectric layer can include a second dielectric material having a second dielectric constant less than the first dielectric constant. In some embodiments of the invention, the second dielectric material includes a low-k dielectric material and the second dielectric constant is less than 3.

The method can further include forming an oxide hard mask on a surface of the gate hard mask and planarizing the contact to a surface of the oxide hard mask such that an overburden remains over the gate hard mask. In this manner, a contact overburden protects the gate hard mask from erosion.

In some embodiments of the invention, the method includes selectively depositing a selective cap on a surface of the contact. The selective cap can be formed in a similar manner as described previously herein with respect to FIGS. 7A, 7B, and 7C.

In some embodiments of the invention, the method includes depositing a liner over a surface of the contact, a surface of the gate hard mask, and on the recessed surface of the first dielectric layer. The liner can be formed in a similar manner as described previously herein with respect to FIGS. 11A, 11B, and 11C.

Figure 15:
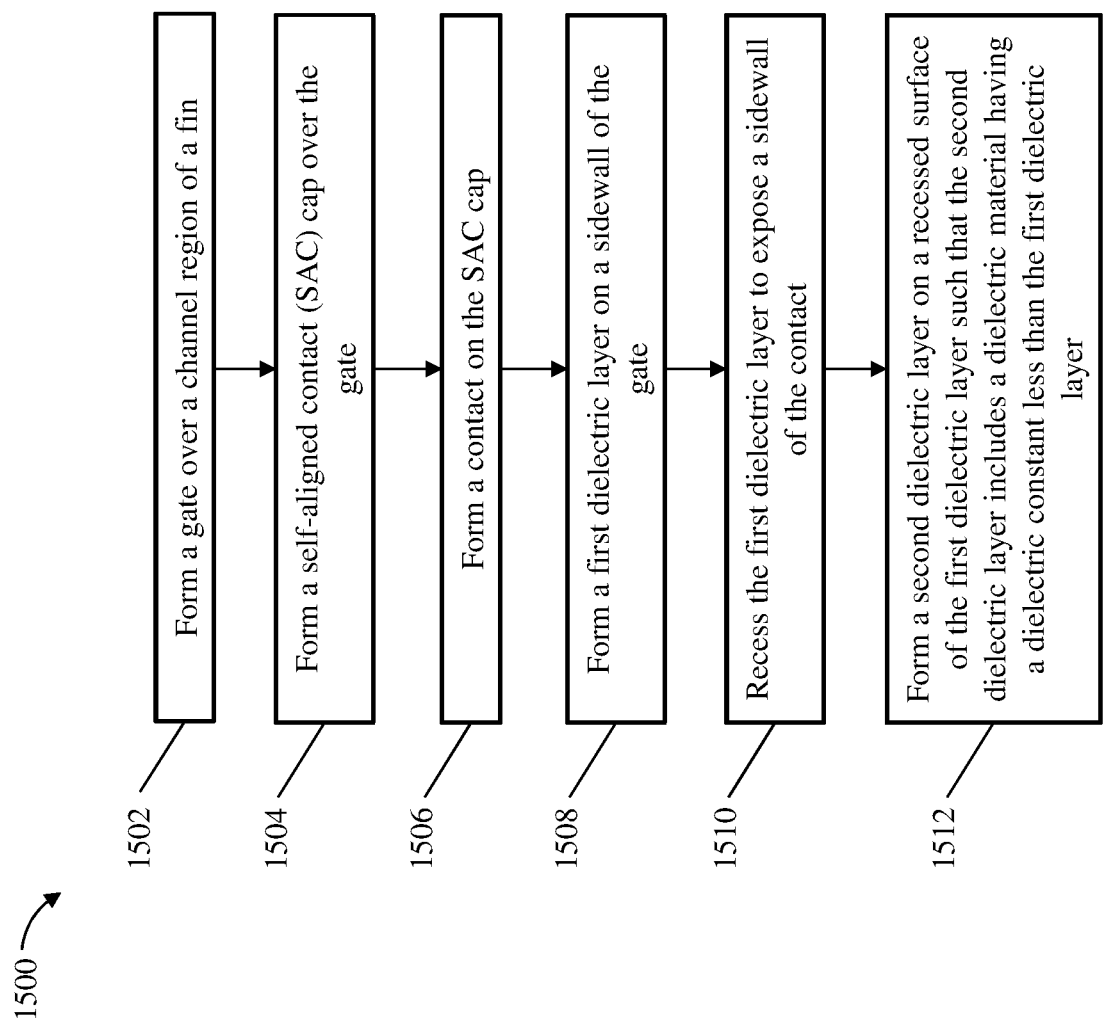
FIG. 15 depicts a flow diagram illustrating a method according to one or more embodiments of the invention.

FIG. 15 depicts a flow diagram 1500 illustrating a method for forming a semiconductor device according to one or more embodiments of the invention. As shown at block 1502, a gate is formed over a channel region of a fin. The gate can include a gate hard mask and a gate spacer. In some embodiments of the invention, the gate hard mask includes silicon nitride.

At block 1504, a SAC cap is formed over the gate. In some embodiments of the invention, the SAC cap includes silicon nitride. At block 1506, a contact is formed on the SAC cap. The contact can include, for example, tungsten or cobalt. In some embodiments of the invention, the contact includes an overburden that covers the SAC cap. As discussed previously herein, the contact can prevent erosion of the SAC cap when recessing the first dielectric layer at block 1510.

At block 1508, a first dielectric layer is formed on a sidewall of the gate. The first dielectric layer can include a first dielectric material having a first dielectric constant. In some embodiments of the invention, the first dielectric material includes silicon oxide and the first dielectric constant is about 3. In some embodiments of the invention, the first dielectric layer is formed on sidewalls of a dummy gate that is subsequently replaced by the gate (e.g., a metal gate) during an RMG module.

At block 1510, the first dielectric layer is recessed to expose a sidewall of the contact. In some embodiments of the invention, recessing the first dielectric layer includes an etch back, such as previously described with respect to FIG. 4B. In some embodiments of the invention, the etch back is selective to a material of the SAC cap and/or a material of the gate hard mask. In some embodiments of the invention, the etch back damages a top portion of the SAC cap, but does not damage the covered active gates, as discussed previously herein.

At block 1512, a second dielectric layer is formed on a recessed surface of the first dielectric layer. The second dielectric layer can include a second dielectric material having a second dielectric constant less than the first dielectric constant. In some embodiments of the invention, the second dielectric material includes a low-k dielectric material and the second dielectric constant is less than 3.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
   forming a gate over a channel region of a fin, the gate comprising a gate spacer and a gate hard mask;
   forming a source adjacent to a first end of the channel region and a drain adjacent to a second end of the channel region;
   forming a contact on the gate hard mask, the contact comprising a first portion on a surface of the source and a second portion on a surface of the drain;
   forming a first dielectric layer on a sidewall of the gate spacer, the first dielectric layer comprising a first dielectric material having a first dielectric constant;
   forming an oxide hard mask on a surface of the gate hard mask;
   planarizing the contact to a surface of the oxide hard mask such that an overburden remains over the gate hard mask;
   recessing the first dielectric layer to expose a sidewall of the contact and a sidewall of the gate spacer; and
   forming a second dielectric layer on a recessed surface of the first dielectric layer, the second dielectric layer comprising a second dielectric material having a second dielectric constant less than the first dielectric constant.

2. The method of claim 1, wherein the contact prevents erosion of the gate hard mask when recessing the first dielectric layer.

3. The method of claim 1, wherein the contact comprises cobalt or tungsten and the gate hard mask comprises silicon nitride.

4. The method of claim 1, wherein the first dielectric material comprises silicon oxide and the first dielectric constant is greater than or equal to 3.

5. The method of claim 4, wherein the second dielectric material comprises a low-k dielectric material and the second dielectric constant is less than 3.

6. The method of claim 2, wherein recessing the first dielectric layer damages a top portion of the contact.

7. The method of claim 1 further comprising selectively depositing a selective cap on a surface of the contact.

8. The method of claim 1 further comprising depositing a liner over a surface of the contact and on the recessed surface of the first dielectric layer.

9. A method for forming a semiconductor device, the method comprising:
   forming a gate over a channel region of a fin;
   forming a self-aligned contact (SAC) cap over the gate;
   forming a contact on the SAC cap;
   forming a first dielectric layer on a sidewall of the gate, the first dielectric layer comprising a first dielectric material having a first dielectric constant;
   recessing the first dielectric layer to expose a sidewall of the contact; and
   forming a second dielectric layer on a recessed surface of the first dielectric layer, the second dielectric layer comprising a second dielectric material having a second dielectric constant less than the first dielectric constant.

10. The method of claim 9, wherein the first dielectric material comprises silicon oxide and the first dielectric constant is about 3.

11. The method of claim 10, wherein the second dielectric material comprises a low-k dielectric material and the second dielectric constant is less than 3.

12. The method of claim 9 further comprising planarizing the contact such that an overburden remains over the SAC cap.

13. The method of claim 9 further comprising selectively depositing a selective cap on a surface of the contact.

14. The method of claim 9 further comprising depositing a liner over a surface of the SAC cap, a surface of the contact, and on the recessed surface of the first dielectric layer.

* * * * *